(12) United States Patent
Yabu et al.

(10) Patent No.: US 8,625,069 B2
(45) Date of Patent: Jan. 7, 2014

(54) EXPOSURE APPARATUS AND METHOD OF MANUFACTURING DEVICE

(75) Inventors: Nobuhiko Yabu, Utsunomiya (JP); Tadao Nakamura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 272 days.

(21) Appl. No.: 12/141,216

(22) Filed: Jun. 18, 2008

(65) Prior Publication Data

US 2008/0316447 A1 Dec. 25, 2008

(30) Foreign Application Priority Data

Jun. 22, 2007 (JP) ................................ 2007-165312

(51) Int. Cl.
G03B 27/68 (2006.01)
G03B 27/52 (2006.01)

(52) U.S. Cl.
USPC .............................................. 355/52; 355/55

(58) Field of Classification Search
USPC ........... 355/53, 67, 68, 75, 77, 55, 52; 430/30
See application file for complete search history.

(56) References Cited

U.S. PATENT DOCUMENTS

| | | | | |
|---|---|---|---|---|
| 4,668,077 | A * | 5/1987 | Tanaka | 355/30 |
| 5,105,075 | A * | 4/1992 | Ohta et al. | 250/201.2 |
| 5,710,620 | A * | 1/1998 | Taniguchi | 355/53 |
| 5,721,608 | A | 2/1998 | Taniguchi | |
| 5,917,581 | A * | 6/1999 | Suzuki | 355/55 |
| 6,235,438 | B1 * | 5/2001 | Suzuki et al. | 430/30 |
| 2003/0035090 | A1 * | 2/2003 | Imai et al. | 355/53 |
| 2003/0128344 | A1 * | 7/2003 | Nishi | 355/52 |
| 2009/0213351 | A1 * | 8/2009 | Kok | 355/67 |
| 2010/0092881 | A1 * | 4/2010 | Mos et al. | 430/30 |
| 2010/0225889 | A1 * | 9/2010 | Sumiyoshi | 355/55 |

FOREIGN PATENT DOCUMENTS

| | | |
|---|---|---|
| JP | 63-16725 B2 | 4/1988 |
| JP | 02-297918 A | 12/1990 |
| JP | 09-148228 A | 6/1997 |
| JP | 2828226 B2 | 9/1998 |
| JP | 2001-102291 A | 4/2001 |
| JP | 2001-297961 A | 10/2001 |
| JP | 2005-012201 A | 1/2005 |
| JP | 2005-183747 A | 7/2005 |
| JP | 2007-206643 A | 8/2007 |

OTHER PUBLICATIONS

English Translation of JP 2001-102291 (dated Apr. 13, 2001).*
English Translation of JP 09-148228 (dated Jun. 6, 1997).*
English Translation of JP 2007-206643 (dated Aug. 16, 2007).*
English Translation of JP 08-234136 (dated Sep. 13, 1996).*

* cited by examiner

*Primary Examiner* — Peter B Kim
*Assistant Examiner* — Deoram Persaud
(74) *Attorney, Agent, or Firm* — Canon U.S.A., Inc. IP Division

(57) ABSTRACT

An exposure apparatus the present invention comprises: an illumination optical system configured to illuminate an illumination area on an original with light from a light source; a projection optical system configured to project a pattern of the original onto a substrate; a first stage configured to hold the original; a second stage configured to hold the substrate; and a controller configured to control driving of at least one of the first stage, the second stage, and an optical element which forms the projection optical system so as to reduce variations in imaging characteristics of the projection optical system, based on a dependence of a transmittance of the pattern on a position in the illumination area.

9 Claims, 13 Drawing Sheets

| | -11.38 | -8.125 | -4.875 | -1.625 | 1.625 | 4.875 | 8.125 | 11.375 |
|---|---|---|---|---|---|---|---|---|
| -14.850 | 0.10 | 0.20 | 0.30 | 0.40 | 0.50 | 0.60 | 0.70 | 0.80 |
| -11.550 | 0.10 | 0.20 | 0.30 | 0.40 | 0.50 | 0.60 | 0.70 | 0.80 |
| -8.250 | 0.10 | 0.20 | 0.30 | 0.40 | 0.50 | 0.60 | 0.70 | 0.80 |
| -4.950 | 0.10 | 0.20 | 0.30 | 0.40 | 0.50 | 0.60 | 0.70 | 0.80 |
| -1.650 | 0.10 | 0.20 | 0.30 | 0.40 | 0.50 | 0.60 | 0.70 | 0.80 |
| 1.650 | 0.10 | 0.20 | 0.30 | 0.40 | 0.40 | 0.30 | 0.20 | 0.10 |
| 4.950 | 0.10 | 0.20 | 0.30 | 0.40 | 0.40 | 0.30 | 0.20 | 0.10 |
| 8.250 | 0.10 | 0.20 | 0.30 | 0.40 | 0.40 | 0.30 | 0.20 | 0.10 |
| 11.500 | 0.10 | 0.20 | 0.30 | 0.40 | 0.40 | 0.30 | 0.20 | 0.10 |
| 14.850 | 0.10 | 0.20 | 0.30 | 0.40 | 0.40 | 0.30 | 0.20 | 0.10 |

FIG. 9

○ EXPOSURE AREA = 26 mm × 33 mm

| | Area1 | Area2 | Area3 | Area4 | Area5 | Area6 | Area7 | Area8 |
|---|---|---|---|---|---|---|---|---|
| | 0.10 | 0.20 | 0.30 | 0.40 | 0.50 | 0.60 | 0.70 | 0.80 |
| | -11.38 | -8.125 | -4.875 | -1.625 | 1.625 | 4.875 | 8.125 | 11.375 |
| -14.850 | 0.10 | 0.20 | 0.30 | 0.40 | 0.50 | 0.60 | 0.70 | 0.80 |
| -11.550 | 0.10 | 0.20 | 0.30 | 0.40 | 0.50 | 0.60 | 0.70 | 0.80 |
| -8.250 | 0.10 | 0.20 | 0.30 | 0.40 | 0.50 | 0.60 | 0.70 | 0.80 |
| -4.950 | 0.10 | 0.20 | 0.30 | 0.40 | 0.50 | 0.60 | 0.70 | 0.80 |
| -1.650 | 0.10 | 0.20 | 0.30 | 0.40 | 0.50 | 0.60 | 0.70 | 0.80 |
| 1.650 | 0.10 | 0.20 | 0.30 | 0.40 | 0.50 | 0.60 | 0.70 | 0.80 |
| 4.950 | 0.10 | 0.20 | 0.30 | 0.40 | 0.50 | 0.60 | 0.70 | 0.80 |
| 8.250 | 0.10 | 0.20 | 0.30 | 0.40 | 0.50 | 0.60 | 0.70 | 0.80 |
| 11.500 | 0.10 | 0.20 | 0.30 | 0.40 | 0.50 | 0.60 | 0.70 | 0.80 |
| 14.850 | 0.10 | 0.20 | 0.30 | 0.40 | 0.50 | 0.60 | 0.70 | 0.80 |

FIG. 10

| r1 | r2 | r3 | r4 | r5 | r6 | r7 | r8 |
|---|---|---|---|---|---|---|---|
| 0.10 | 0.20 | 0.30 | 0.40 | 0.50 | 0.60 | 0.70 | 0.80 |

| Case | 1 | 2 |
|---|---|---|
| Y (mm) | 33.0 | 16.5 |
| Speed (mm/sec) | 100 | 100 |
| t (sec) | 0.33 | 0.165 |
| tn | 0.67 | 0.33 |

K=K1×0.67+K2×0.33

F I G. 18
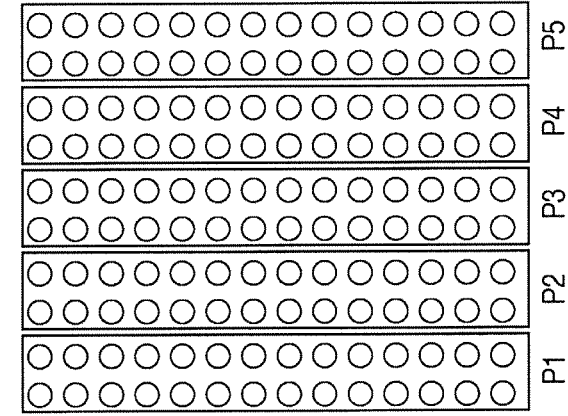
(EXAMPLE 1)
CASE IN WHICH VARIATION IN IMAGING CHARACTERISTIC IS PREDICTED AT ALL OF 10 MASK TRANSMITTANCE MEASUREMENT POINTS
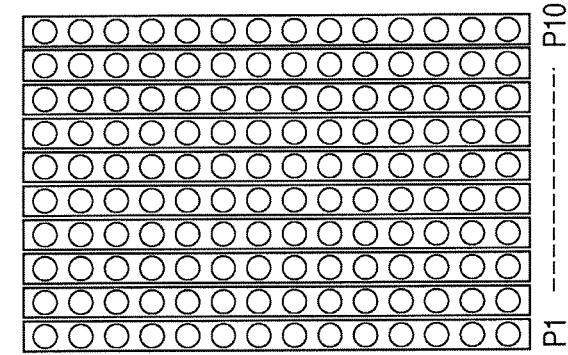
(EXAMPLE 2)
CASE IN WHICH VARIATION IN IMAGING CHARACTERISTIC IS PREDICTED AT 5 OF 10 MASK TRANSMITTANCE MEASUREMENT POINTS

EXPOSURE APPARATUS AND METHOD OF MANUFACTURING DEVICE

BACKGROUND OF THE INVENTION

1. Field of the Invention

The present invention relates to an exposure apparatus in which variations in imaging characteristics are reduced.

2. Description of the Related Art

A process of manufacturing a semiconductor device such as an LSI or VLSI formed from an extra fine pattern has conventionally adopted a reduction projection exposure apparatus which reduces and prints by exposing a circuit pattern drawn on a mask on a substrate (also called a "wafer") coated with a photosensitive agent, thereby forming a desired pattern on the substrate. Along with an improvement in the packaging density of semiconductor devices, further micro-patterning is becoming necessary. A demand for micropatterning on the exposure apparatus is increasing along with the development of the resist process.

To improve the resolving power of an exposure apparatus, there are a method of shortening the exposure light wavelength and a method of increasing the numerical aperture (NA) of a reduction projection lens. As the resolving power increases, the depth of focus of the reduction projection lens decreases. It is therefore important to improve the focus accuracy of focusing the wafer surface on the imaging plane (focal plane) of the reduction projection lens. One important optical characteristic of the projection exposure apparatus is the alignment accuracy of precisely aligning various patterns obtained by a plurality of processes. An important factor which influences the alignment accuracy is a magnification error of the reduction projection lens. Along with a stronger trend toward further micropatterning of a VLSI every year, a need for improving the alignment accuracy is becoming stronger. It is therefore very important to maintain the magnification of the reduction projection lens at a predetermined value.

A reduction projection lens is known to partially absorb exposure energy so that the temperature of the reduction projection lens changes due to heat generated by the absorption, leading to a change in the optical characteristics of the reduction projection lens, such as the refractive index. When the reduction projection lens is continuously irradiated with exposure light for a long period of time, the imaging characteristics (including at least one of the focus, magnification, and wavefront aberrations such as astigmatism aberration and distortion aberration) of the reduction projection lens vary. This may result in non-negligible amounts of focus errors or alignment errors. Under the circumstance, there is proposed a method of correcting variations in imaging characteristics, which occur when exposure energy is applied to the reduction projection lens.

For example, the applicant of Japanese Patent Publication No. 63-16725 proposes calculating the amounts of variations in imaging characteristics, which occur when exposure energy is applied to the reduction projection lens by model equations using, e.g., the exposure amount, exposure time, and non-exposure time as variables. Based on the calculation result, the variations in imaging characteristics of the projection optical system are corrected. The model equations have imaging characteristic-specific coefficients unique to the reduction projection lens. Measuring the coefficients makes it possible to correct the variations in the imaging characteristics of the reduction projection lens.

There is also proposed an exposure apparatus which can obtain a more excellent projection resolving power for a specific pattern by changing the illumination shape. In such an apparatus, a light source distribution generated on the pupil surface of the reduction projection lens changes depending on the exposure conditions (e.g., the numerical aperture of a projection system, the numerical aperture of an illumination system, the exposure area, the exposure center position, and the exposure mask). Therefore, the variation amounts of imaging characteristics change for the respective exposure conditions.

Under the circumstance, there is proposed an exposure method of satisfactorily adjusting the variations in imaging characteristics even when the distribution of energy applied to the reduction projection lens changes. For example, Japanese Patent No. 2828226 proposes a method of storing imaging characteristic correction coefficients corresponding to various states of the illumination light source distribution, and reading out corresponding correction information when the state of the light source distribution is changed, performing correction based on the readout information. To precisely correct variations in imaging characteristics corresponding to various states of the illumination light source distribution, it is necessary to calculate a correction coefficient best suited to a set of exposure conditions of interest from pieces of information on, e.g., the state of the illumination light source distribution on the pupil plane, the reticle transmittance, the dimensions of the exposure area in the scanning direction and in a direction perpendicular to the scanning direction, the scanning speed, the exposure amount, and the irradiation time.

It is necessary to calculate a correction coefficient best suited to a set of exposure conditions of interest. For this purpose, the transmittance of a mask needs to be calculated from mask transmittance information (e.g., mask transmittance map information/mask design information) and information on the exposure area on the mask. However, the prior arts do not take account of the difference in transmittance (the difference in pattern density) attributed to the image height in the illumination area. Still worse, even when the pattern density in the illumination area is calculated from the mask transmittance information and illumination area information, correction systems in the prior arts have poor correction capabilities.

Nowadays, however, the correction systems are being upgraded to meet a demand for an improvement in the accuracy of the exposure apparatus. This has made it possible to correct variations in imaging characteristics which depend on the image height in the illumination area.

SUMMARY OF THE INVENTION

It is an object of the present invention to provide an exposure apparatus in which variations in imaging characteristics attributed to the dependence of the transmittance of a pattern formed on a mask on the position in the illumination area are reduced.

According to the present invention, there is provided an exposure apparatus comprising an illumination optical system configured to illuminate an illumination area on an original with light from a light source; a projection optical system configured to project a pattern of the original onto a substrate; a first stage configured to hold the original; a second stage configured to hold the substrate; and a controller configured to control driving of at least one of the first stage, the second stage, and an optical element which forms the projection optical system so as to reduce variations in imaging characteristics of the projection optical system, based on a dependence of a transmittance of the pattern on a position in the illumination area.

Further features of the present invention will become apparent from the following description of exemplary embodiments with reference to the attached drawings.

BRIEF DESCRIPTION OF THE DRAWINGS

FIG. 9 is a table showing an approach to calculating the mask transmittances in the divided illumination areas;

FIG. 10 is a table showing normalized mask transmittances in the divided illumination areas;

FIG. 18 is a view showing the transmittance map image height and aberration correction equation.

DESCRIPTION OF THE EMBODIMENTS

Variations in imaging characteristics in an exposure apparatus according to embodiments of the present invention include a variation in at least one of the focus, magnification aberration, distortion aberration, astigmatism aberration, spherical aberration, coma aberration, and other wavefront aberrations. As is well known in the technical field of the present invention, the wavefront aberrations are expressed as the respective terms of an expression obtained by expanding the wavefront shape using the Zernike polynomial. These wavefront aberrations are also collectively called "aberration".

First Embodiment

Figure 1:
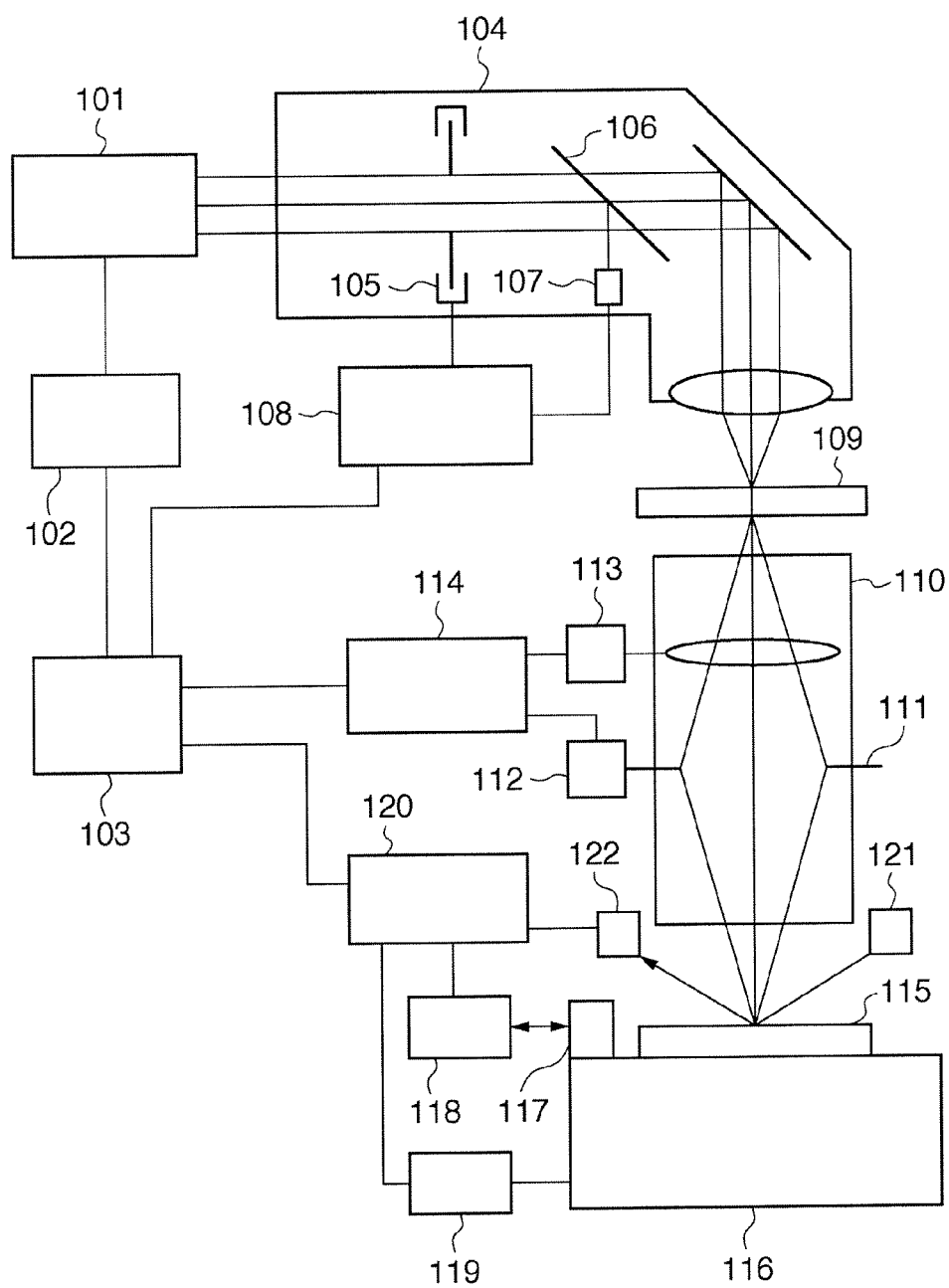
FIG. 1 is a schematic view showing an exposure apparatus according to an embodiment of the present invention.

FIG. 1 shows the schematic arrangement of a scanning exposure apparatus according to an embodiment of the present invention. A pulse laser source 101 contains, e.g., ArF gas and emits a laser beam with a far-ultraviolet wavelength of 193 nm. The pulse laser source 101 includes, e.g., a front mirror which constitutes a resonator, a wavelength range narrowing module which includes, e.g., a diffraction grating and prism and narrows the exposure wavelength range, a monitor module which includes, e.g., a spectroscope and detector and monitors the wavelength stability and spectral width, and a shutter.

A laser controller 102 performs, e.g., the control of gas exchange, wavelength stabilization, and a discharge voltage in the pulse laser source 101. In this embodiment, the control is not performed by the laser controller 102 alone and can be performed in accordance with an instruction from a main controller 103 for the overall exposure apparatus, which is connected to the laser controller 102 via an interface cable.

The beam emitted by the pulse laser source 101 is shaped into a desired beam shape via a beam shaping optical system of an illumination optical system 104, enters an optical integrator, and forms a large number of secondary sources to illuminate a mask 109 with a uniform illuminance distribution.

An aperture stop 105 of an illumination system has a nearly circular aperture so that an illumination system controller 108 can set the aperture diameter of the aperture stop 105 and, eventually, the numerical aperture of the illumination optical system 104 to desired values. Since the ratio of the numerical aperture of the illumination optical system 104 to that of a projection optical system 110 is the coherence factor ($\sigma$ value), the illumination system controller 108 can set the $\sigma$ value by controlling the aperture stop 105 of the illumination system.

A half mirror 106 is inserted into the optical path of the illumination optical system 104. A certain component of exposure light, which illuminates the mask 109, is reflected and extracted by the half mirror 106. An ultraviolet photosensor 107 is inserted in the optical path of the light component reflected by the half mirror 106, and generates an output corresponding to the intensity (exposure energy) of the exposure light.

The output from the photosensor 107 is converted into exposure energy per pulse by an integration circuit (not shown) which performs integration for each pulse emission of the pulse laser source 101. The converted exposure energy is input to the main controller 103 which controls the overall exposure apparatus via the illumination system controller 108.

The circuit pattern of a semiconductor device to be printed is formed on the mask (reticle) 109 serving as an original. The illumination optical system 104 irradiates the illumination area (exposure slit) on the mask 109 with a laser beam. The mask 109 is held by a mask stage (not shown). The mask stage moves the mask 109 to scan the mask 109 with a laser beam (illumination area), thereby exposing the exposure area on the mask 109. The projection optical system 110 is set so as to reduce the circuit pattern image of the mask 109 at a reduction magnification $\beta$ ($\beta$ is, e.g., ¼) and image and project the reduced image onto a wafer 115 serving as a photosensitive substrate coated with a photoresist. The pattern formed on the mask 109 is transferred onto the wafer 115 serving as a substrate via the projection optical system 110. An aperture stop 111 of the projection optical system 110 has a nearly circular aperture and is inserted on the pupil plane (the Fourier transformation plane with respect to the reticle) of the projection optical system 110. By controlling the aperture diameter of the aperture stop 111 using a driver 112 such as a motor, the numerical aperture of the aperture stop 111 can be set to a desired value.

A field lens driver 113 moves a field as a constituent element of a lens system in the projection optical system 110 onto the optical axis of a reduction projection lens using, e.g., the air pressure or a piezoelectric element, so that deterioration in various aberrations of the reduction projection lens is prevented and a satisfactory projection magnitude is ensured, thus reducing distortion errors. A projection lens controller 114 controls optical elements of the projection optical system 110.

A wafer stage 116 serving as a second stage which holds a substrate can three-dimensionally move along the optical axis direction (Z direction) of the projection optical system 110 and on a plane (X-Y plane) perpendicular to this direction. A laser interferometer 118 measures the distance between the wafer stage 116 and a movable mirror 117 fixed to it, thereby detecting the position of the wafer stage 116 on the X-Y plane. A stage controller 120 under the control of the main controller 103 of the exposure apparatus detects the position of the wafer stage 116 by the laser interferometer 118 and controls a driver 119 such as a motor to move the wafer stage 116 to a predetermined position on the X-Y plane. A mask stage controller, the stage controller 120, the projection lens controller 114, and the main controller 103 constitute a controller which controls the driving of the optical elements of the projection optical system, the first stage which holds the mask, and the second stage which holds the substrate.

A light-projecting optical system 121 and detection optical system 122 constitute a focal plane detector. The light-projecting optical system 121 projects a plurality of light beams formed from non-exposure light which does not expose the photoresist on the wafer 115. The light beams are converged on the wafer 115 and reflected by it. The light beams reflected by the wafer 115 enter the detection optical system 122. Although not shown, a plurality of position detection light-receiving elements are inserted in the detection optical system 122 in correspondence with the respective reflected light beams. The light-receiving surface of each position detection light-receiving element is set nearly conjugate to a corresponding light beam reflection point on the wafer 115 by an imaging optical system. A positional shift of the surface of the wafer 115 in the optical axis direction of the projection optical system 110 is measured as a positional shift of the incident light beam on the position detection light-receiving element in the detection optical system 122.

Model equations of a variation in the aberration of the projection optical system 110 upon exposure energy irradiation, and a correction coefficient used to quantize the model equations according to this embodiment will be explained.

Figure 2:
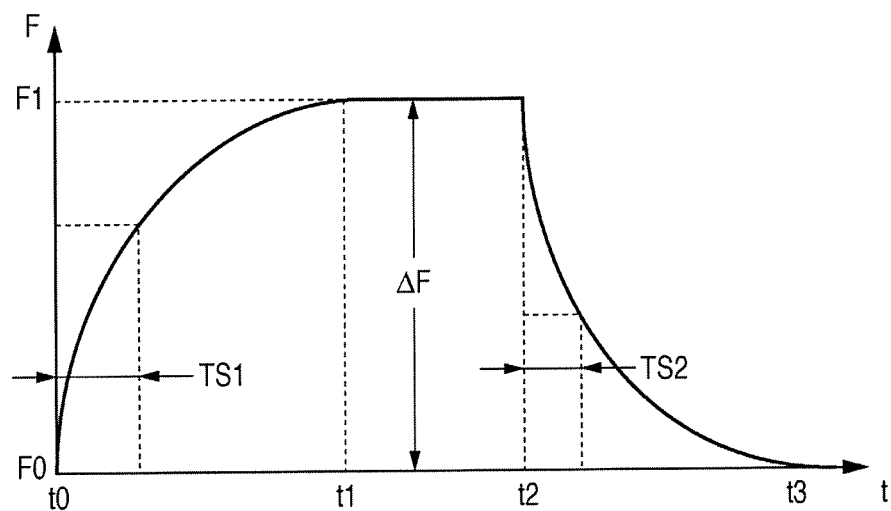
FIG. 2 is a graph showing the irradiation variation characteristic of the aberration of a reduction projection lens.

FIG. 2 shows an example of a temporal change in the aberration of the projection optical system by exposure. The abscissa indicates a time t, and the ordinate indicates an aberration variation amount ΔF at a certain image height of the projection optical system 110. The aberration herein means, e.g., the focus, magnification, distortion, astigmatism aberration, spherical aberration, and coma aberration. The aberration variation amount ΔF generally takes an image height-specific value. The initial amount of aberration of the projection optical system 110 is indicated by F0. As the projection optical system 110 starts exposure upon receiving exposure light from the pulse laser source 101 at time t0, the amount of aberration varies with time and becomes stable upon reaching a predetermined amount of aberration F1 at time t1. After that, even when the exposure light is continuously applied to the projection optical system 110, the amount of aberration does not change from F1 because energy which transforms into heat upon being absorbed by the projection optical system 110 equilibrates with thermal energy discharged by the projection optical system 110. As the exposure is stopped at time t2, the amount of aberration returns to the original state with time and reaches the initial amount of aberration F0 at time t3.

Time constants TS1 and TS2 in FIG. 2 are equivalent to those of the heat transfer characteristic of the projection optical system 110. Since these time constants are aberration-specific values unique to the projection optical system 110, they are acquired for each apparatus and aberration in inspecting the projection optical system 110.

A method of calculating the maximum amount of aberration variation F1 in FIG. 2 will be explained. The maximum amount of aberration variation F1 can be expressed by:

$$F1 = K \times Q \tag{1}$$

where K is the amount of aberration variation per unit amount of light (unit exposure energy) as a correction coefficient, and Q is a value calculated from the parameters of conditions (e.g., information on the exposure amount, scanning speed, and exposure area) which determine actual exposure energy.

Let $\Delta F_k$ be the amount of aberration at a certain time. Then, using the maximum amount of variation F1 and the time constants TS1 and TS2 stored for each aberration, an amount of aberration $\Delta F_{k+1}$ after exposure for only a time period $\Delta t$ from the certain time $\Delta F_k$ is approximated by:

$$\Delta F_{k+1} = \Delta F_k + F1 \times (1 - \exp(-\Delta t/TS1)) \tag{2}$$

Likewise, an amount of aberration $\Delta F_{k+1}$ when exposure is not performed for the time period $\Delta t$ from the certain time $\Delta F_k$ is approximated by:

$$\Delta F_{k+1} = \Delta F_k \times \exp(-\Delta t/TS2) \tag{3}$$

A curve indicating the irradiation variation characteristic of the aberration of the projection optical system 110 shown in FIG. 2 is modeled by the functions in equations (2) and (3) to predict a variation in the aberration of the projection optical system due to the generation of exposure heat. Note that the modeling functions in equations (1), (2), and (3) are merely an example, and the curve may be modeled using other equations.

A correction coefficient K necessary for correcting a variation in imaging characteristic, which occurs upon exposure in accordance with the illumination area and the dependence of the pattern transmittance on the position in it, needs to be calculated for each exposure condition. This is because when the exposure conditions change, the energy density distribution of light which enters the projection optical system 110 changes, resulting in changes in the amount of aberration variation of the projection optical system and in its dependence on the image height. The exposure conditions herein mean the effective light source shape, the mask pattern, and the exposure area on the mask.

In order to calculate a correction coefficient corresponding to the energy distribution of light which enters the projection optical system, a first process of calculating and storing a correction coefficient for predicting a variation in the aberration of the projection optical system by taking account of the illumination area on the mask and the dependence of the pattern transmittance on the position in it will be explained.

Figure 3:
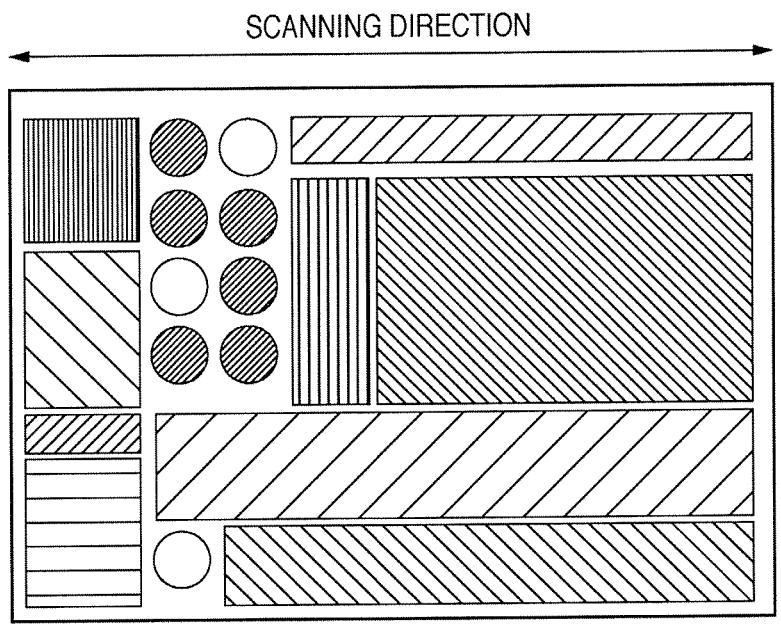
FIG. 3 is a view showing an example of the mask pattern layout.

As shown in FIG. 3, an exposure pattern is laid out on the mask. The pattern layout is generally nonuniform in the entire mask area, and the pattern density, i.e., pattern transmittance has a deviation. For this reason, even if the energy distribution of irradiation light is uniform over the entire mask surface, the energy distribution of a light component transmitted through the pattern is nonuniform. This deviation in the energy distribution is averaged by scanning in the scanning direction (in this case, the Y direction), but it remains in a direction (in this case, the X direction) perpendicular to the scanning direction as a difference in image height of the energy distribution.

Figure 4:
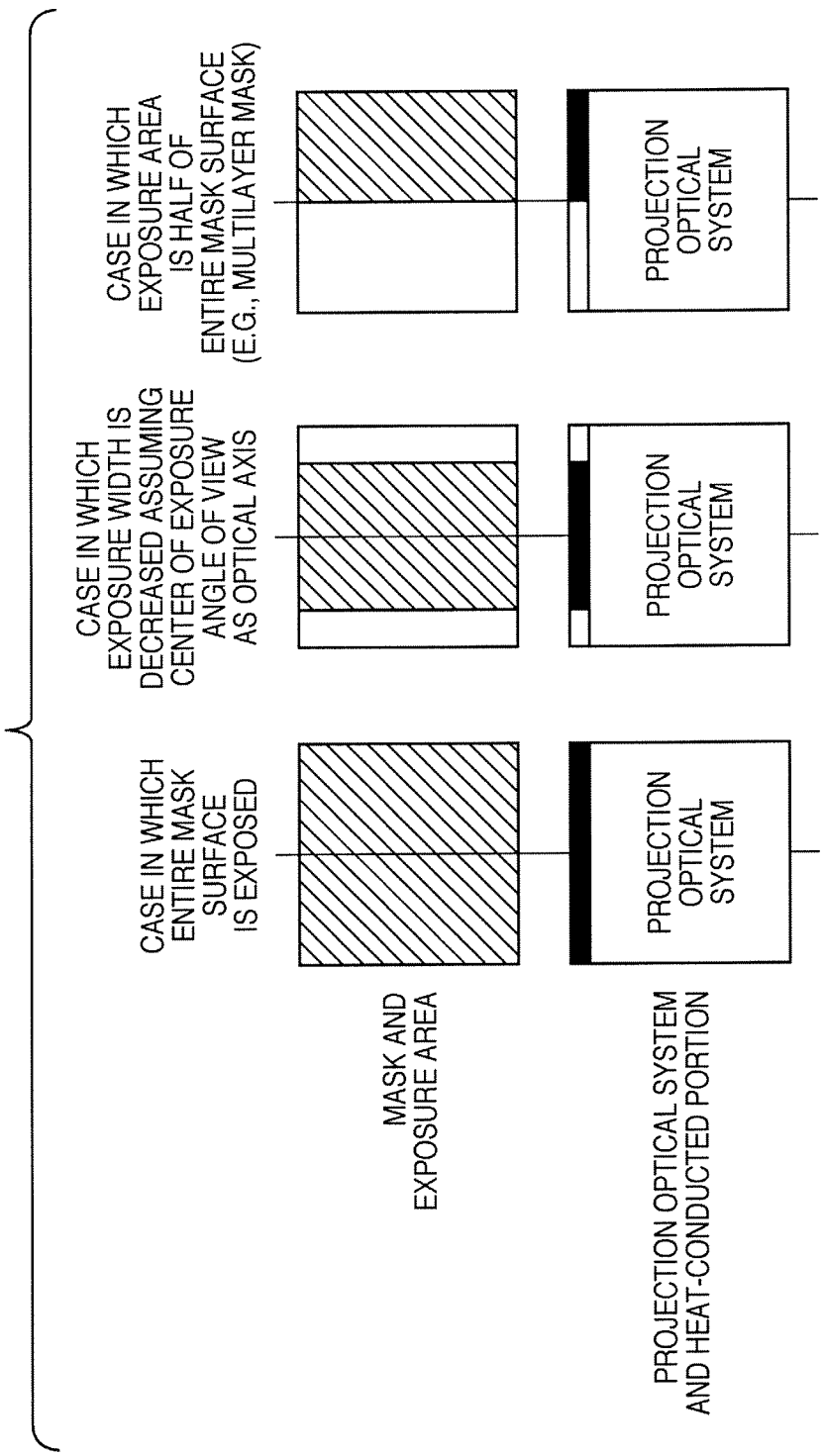
FIG. 4 is a view showing the relationship between the exposure area on a mask and the irradiation area of a projection optical system.

As shown in FIG. 4, there is a case in which the mask is partially shielded by a light-shielding member so that exposure is performed by limiting the mask exposure area. In this case, a difference in image height of the energy distribution is influenced by a mask range determined as the exposure area.

Figure 5:
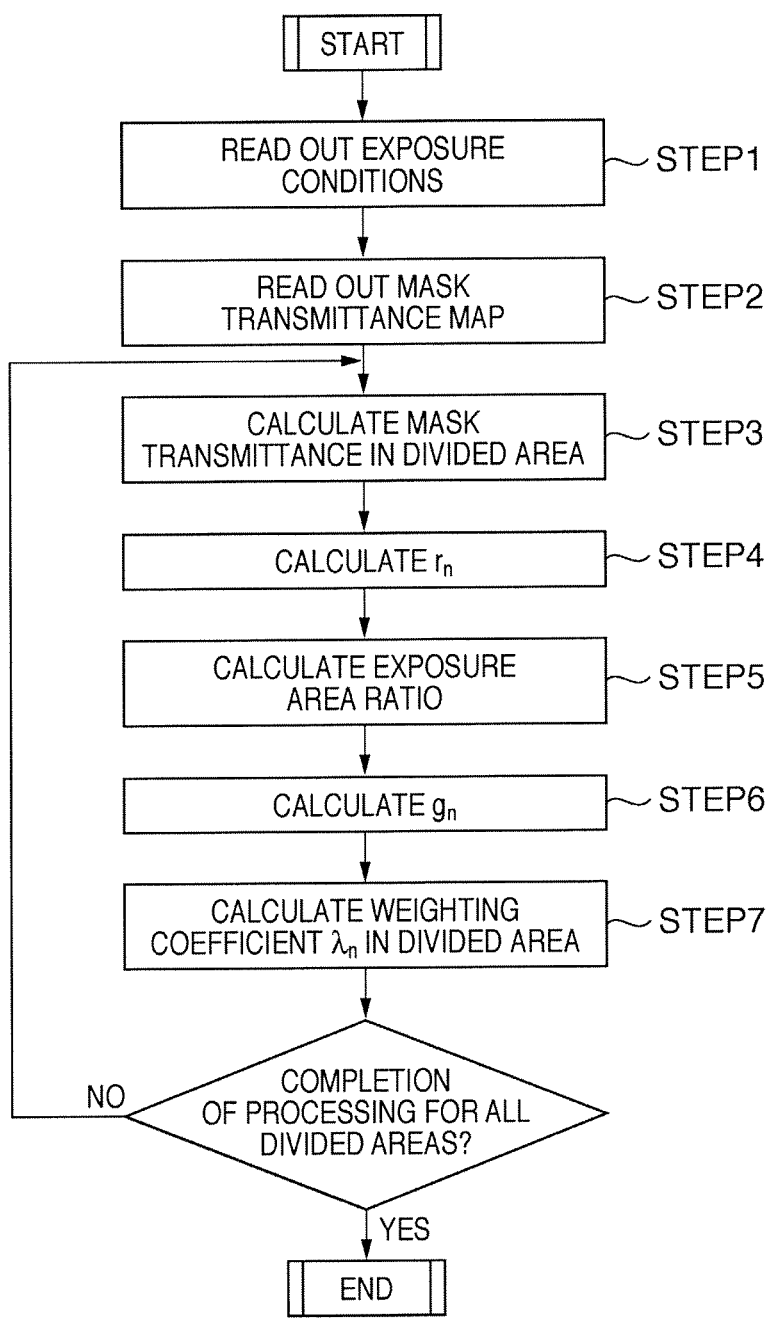
FIG. 5 is a flowchart illustrating how to calculate a correction coefficient.

In this embodiment, a method of calculating a correction coefficient by taking account of the pattern transmittance distribution and illumination area will be explained. FIG. 5 illustrates a correction coefficient calculation sequence. A first calculator of the main controller 103 performs the correction coefficient calculation.

Figure 6:
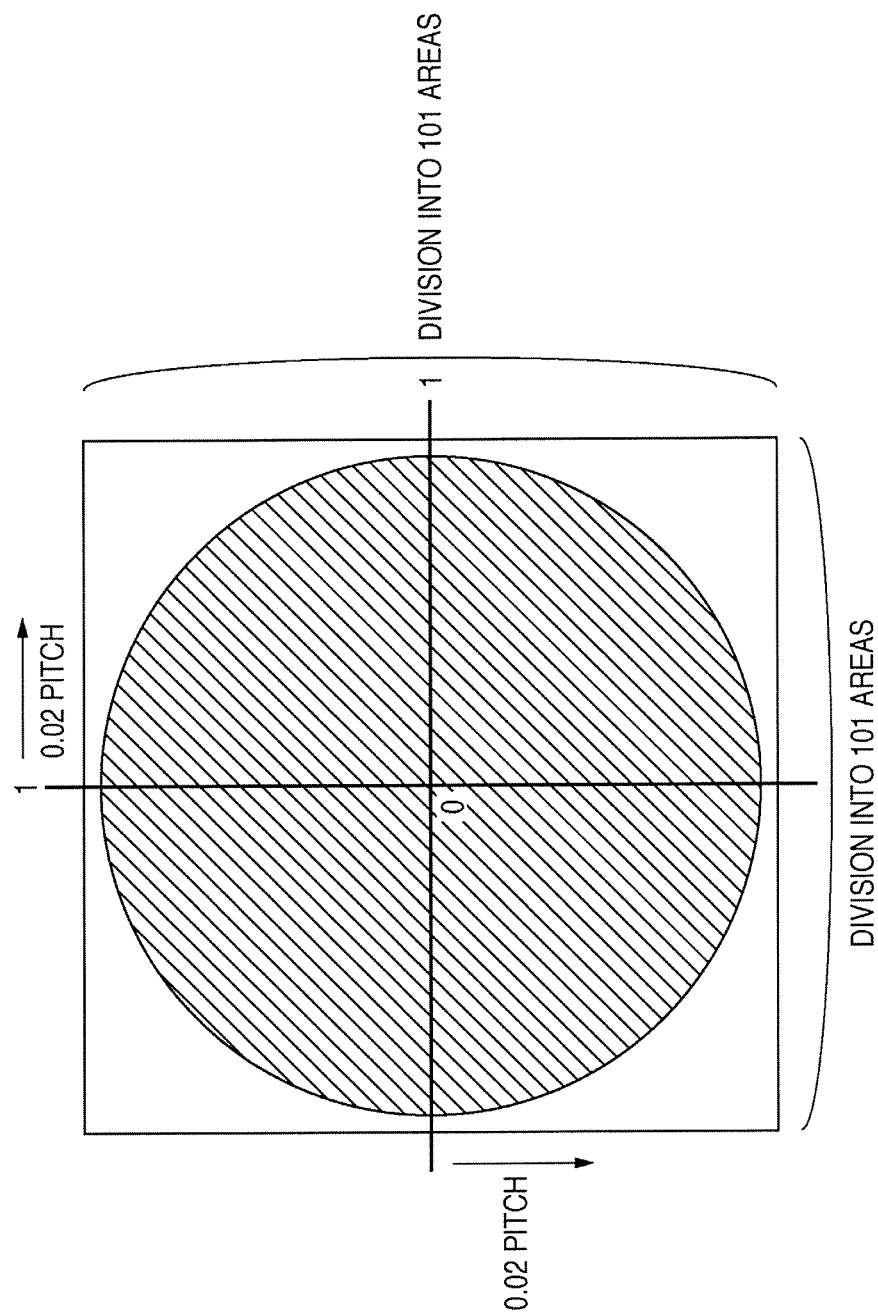
FIG. 6 is a view showing the light intensity distribution on the pupil plane.

In step 1, the first calculator writes information of the exposure conditions to a memory. The pieces of the information are the type of an exposure mask, the illumination area, and the effective light source shape. The effective light source shape information is obtained in advance based on the measurement result and/or the simulation result obtained by a computer. For example, as shown in FIG. 6, the pupil plane is divided into 101×101 areas so that a pupil plane light intensity map generated by normalizing the light intensity in each area by a maximum light intensity is used as the effective light source shape information.

Figures 7, 8:
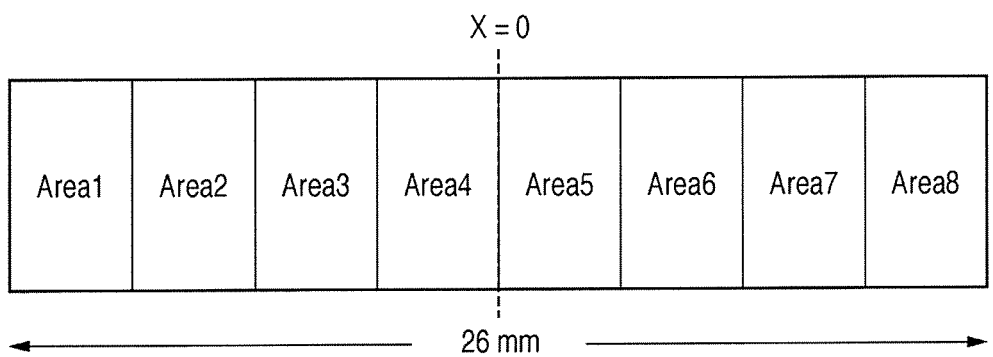
FIG. 7 is a table showing a mask transmittance map.
FIG. 8 is a view showing divided illumination areas.

In step 2, the first calculator reads out exposure mask transmittance information (to be referred to as a mask transmittance map hereinafter) as shown in FIG. 7. This information is light amount data in a matrix, which is obtained by measuring the amounts of light of a projected image on the entire mask surface under appropriate measurement conditions. The apparatus measures and stores the mask transmittance map for each mask. Although the mask transmittance map uses matrix data defined by 8 data points in the X direction and 10 data points in the Y direction in this embodiment, the amounts of light may be acquired at an arbitrary number of data points in an arbitrary area. Also, although a mask transmittance map generated by the exposure apparatus is used in this embodiment, the mask transmittance may be calculated based on, e.g., mask design information (e.g., CAD information). When the mask transmittance map information or mask design information is used by a plurality of exposure apparatuses, the information may be stored in a server which allows a plurality of exposure apparatuses to commonly use it.

In step 3, as the first calculation processing procedure, the first calculator divides the illumination area into a plurality of areas in the X direction, and individually calculates the mask transmittances in the respective divided areas. In this embodiment, the dimension of the illumination area in the X direction is 26 mm (a value when converting the dimension of the illumination area in the X direction on the mask into that on the wafer). Although this embodiment will exemplify a case in which the illumination area is divided into 8 areas with equal areas as shown in FIG. 8, the number of divided areas may be an arbitrary one of 2 or more. The divided areas are obtained by dividing the range within which the exposure light enters the projection optical system into a plurality of areas. As shown in FIG. 9, the mask transmittance in the divided area (to be referred to as divided area n; n is the area number that is one of 1 to 8 in this embodiment) is calculated as the average of transmittance data in a mask area scanned along division area n by:

(the mask transmittance in divided area $n$)=($\Sigma$ transmittance data)/(the number of data points)

(Note that the $\Sigma$ range is defined as only a mask area scanned along divided area n)

In step 4, the first calculator normalizes the mask transmittance in divided area n, and calculates a mask transmittance $r_n$ in each divided area, as shown in FIG. 10.

In steps 5 and 6, the first calculator calculates an exposure area ratio $g_n$ of divided area n based on exposure area information. The exposure area information herein includes a dimension w of the exposure area in the X direction, and an X-image height $x_0$ at the center of the exposure area. These pieces of information can be substituted by X-coordinates xr and x1 at the two ends of the exposure area. The dimension of the exposure area in the Y direction is taken into consideration as the scanning distance not herein but in a calculation process to be described later.

The $g_n$ value is given as the area ratio between divided area n and a portion in divided area n, which is included in the illumination area under a certain set of exposure conditions. That is, the $g_n$ value can be calculated on a case-by-case basis as follows:

A case in which divided area n is included in the illumination area: $g_n=1$

Figure 11:
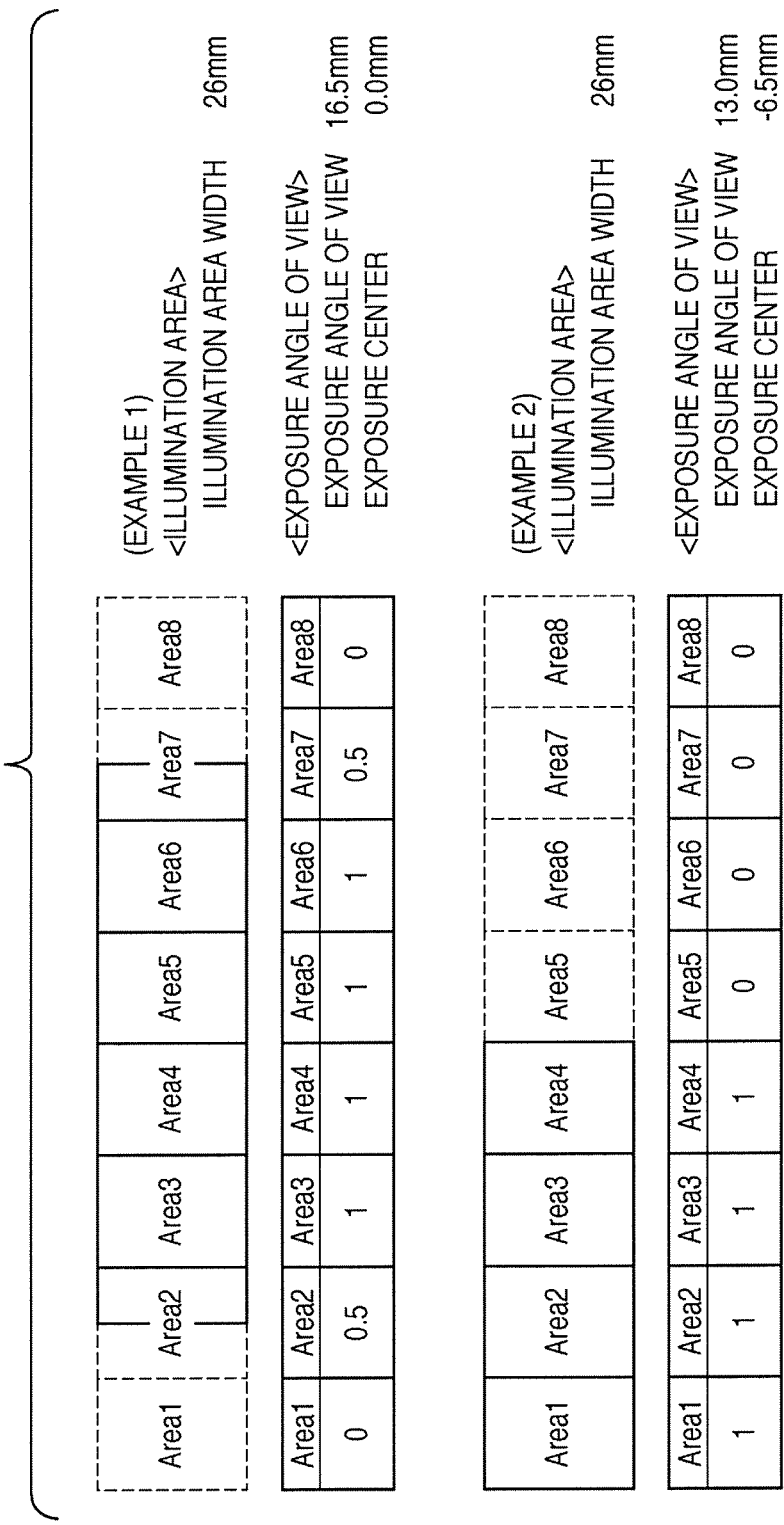
FIG. 11 is a table showing an approach to calculating a weighting coefficient from the divided illumination areas.

A case in which divided area n is not included in the illumination area: $g_n=0$ A case in which divided area n is partially included in the illumination area: $g_n$=((the ratio of a portion in divided area n, which is included in the illumination area)/(the area of divided area n)) FIG. 11 shows a detailed example of the calculation result.

In step 7, the first calculator calculates the weighting coefficient from the mask transmittance information and exposure area information. Let $\lambda_n$ be the weighting coefficient calculated by multiplying the $r_n$ value calculated from the mask transmittance by the $g_n$ value calculated from the exposure area information. Then, the coefficient $\lambda_n$ corresponds to a value obtained by normalizing the amount of light energy which propagates through divided area n.

Steps 3 to 7 are repeated for each divided area n (eight times in this embodiment), and the weighting coefficient $\lambda_n$ in each divided area n is calculated and stored.

Using the calculated weighting coefficient $\lambda_n$ for each divided area, an aberration function:

$$f_n^{I,C}(x) \quad (1)$$

is weighted, where n is the divided area number, I is the effective light source shape on the pupil plane, C is the type of aberration, and x is an arbitrary X-image height. Expression (1) represents the degree of influence of the mask transmittance and exposure area on the aberration C as an imaging characteristic, which is generated by the projection optical system when divided area n is exposed with the effective light source shape I by the unit exposure amount, as a function of the image height x. That is, the aberration function means the degree of influence, on the imaging characteristic, of the mask transmittance and exposure area determined for each of the plurality of areas obtained by dividing the range within which the exposure light enters the projection optical system. The image height x is not particularly limited to image heights inside the divided area n. This means that the light which enters the divided area n can change the aberration not only at image heights inside the divided area n but also at image heights outside the divided area n. The aberration function and its coefficients generally differ for each aberration C, e.g., a function for focus is not necessarily equal to one for image shift. In general, the coefficients also differ for each effective light source shape I. In this embodiment, an appropriate function is selected based on the effective light source information read out in step 1. The dependence of the aberration on the image height only in the X direction is expressed as a function in this embodiment. However, when the dependence of the aberration on the image height in the Y direction needs to be taken into consideration in aberration correction to be described hereinafter, the aberration function may be expanded into:

$$f_n^{I,C}(x,y) \quad (2)$$

where y is an arbitrary Y-image height.

The aberration function given by expression (1) is calculated in advance based on the aberration measurement result and/or simulation result. However, since it is difficult to calculate the value of expression (1) for an arbitrary divided area n, arbitrary effective light source shape I, and arbitrary image height x, expression (1) may be determined by appropriately interpolating using the values calculated for several values each of n, I, and x.

Letting $x_{0n}$ be the image height at the center of divided area n, the aberration function in expression (1) may be substituted by:

$$f_n^{I,C}(x) \rightarrow F^{I,C}(x,x_{0n}) \quad (3)$$

so that the aberration function $F^{I,C}(x,x_{0n})$ is used for all divided areas 1 to 8.

The amount of variation in the aberration C due to the influence of each divided area under specific exposure conditions can be calculated by multiplying the function in expression (1) by the weighting coefficient $\lambda_n$. This calculation is valid because the weighting coefficient $\lambda_n$ corresponds to the amount of light which enters divided area n under the exposure conditions, and the amount of aberration variation is proportional to the amount of incident light as is commonly known. Assume, for example, that the image height coordinate position to predict a variation in focus is (0.0), the effective light source shape under the exposure conditions is I, the number of divided areas is 8, and the weighting coefficient in each divided area is $\lambda_n$. Then, the amount of variation in aberration due to the influence of each divided area can be expressed by:

$$\lambda_1 \times f_1^{I,Focus}(0.0), \lambda_2 \times f_2^{I,Focus}(0.0)), \ldots, \lambda_8 \times f_8^{I,Focus}(0.0)$$

A variation in aberration under the exposure conditions is calculated as the sum of variations in aberrations due to the influence of the divided areas. In the above-described example, the correction coefficient of a variation in focus at the image height coordinate position (0.0) under the exposure conditions is given by:

$$K^{Focus}(0.0) = \sum_{n=1}^{8} \lambda_n f_n^{I,Focus}(0.0) \quad (4)$$

which corresponds to K in equation (1).

The correction coefficient K can be calculated based on information on at least one of the light intensity distribution on the pupil plane of the projection optical system, the scanning speed, and the exposure time, in addition to the pattern transmittance distribution information and exposure area information.

These processing operations are performed for a combination of the number of image height coordinate positions to be corrected and that of aberrations to be corrected, thereby calculating the correction coefficient for each image height and aberration.

Figures 12, 13:
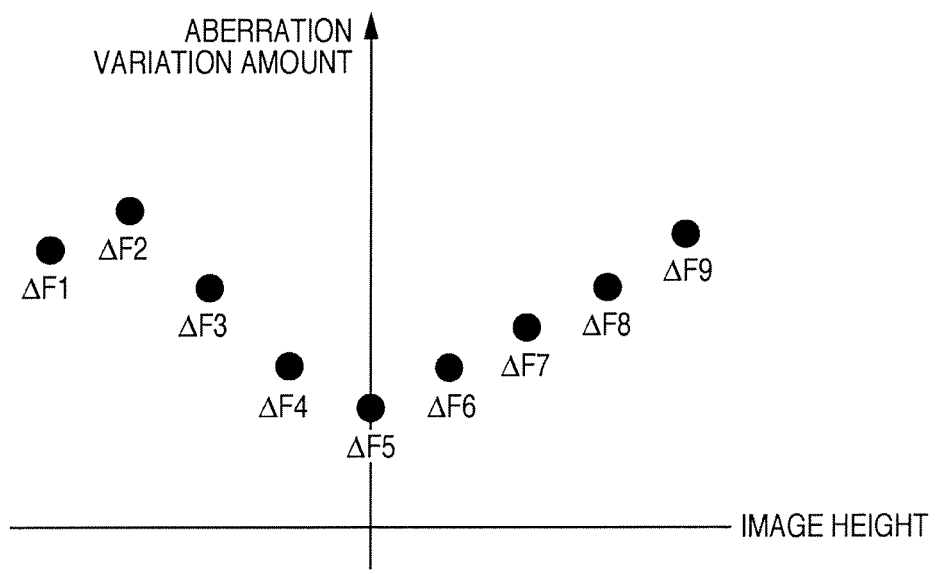
FIG. 12 is a table showing an exposure time weighting method.
FIG. 13 is a graph showing the relationship between the image height and the amount of aberration variation.

A correction coefficient commonly used in a plurality of exposure conditions can be calculated by weighting correction coefficients under the respective exposure conditions by the irradiation time (or the dimension of the exposure area in the Y direction/scanning speed), as shown in FIG. 12. In this case, the correction coefficient K used in two sets of exposure conditions is the weighted average of the correction coefficients K1 and K2, which are calculated under the respective sets of exposure conditions, by the irradiation time.

A second process of, when the current exposure conditions are changed, reading out a correction coefficient according to this change and calculating and predicting the amount of aberration variation under the exposure conditions at an arbitrary image height will be explained. A second calculator of the main controller 103 calculates the amount of variation in aberration as an imaging characteristic of the projection optical system based on the calculated correction coefficient and exposure conditions.

The calculation for predicting a variation in the aberration of the projection optical system is done at one or more image heights. The calculation of a variation in the aberration of the projection optical system includes the calculation of the exposure time (Heating) and non-exposure time (Cooling). The former is calculated by equation (2), while the latter is calculated by equation (3).

The F1 value used in equation (2) is calculated using the correction coefficient K calculated in the first process. The correction coefficient K is calculated for each image height and aberration in the first process.

The parameter Q in equation (1) includes one of, e.g., the exposure time, amount of exposure, and scanning speed. The F1 value can be calculated by combining the parameter Q with the correction coefficient. In this embodiment, a value common to a plurality of image heights is used as the parameter Q.

FIG. 13 shows the state in which the F1 value changes for each image height because, even for the same aberration (e.g., the focus), the exposure area or mask pattern density changes and so the correction coefficient K changes. In this embodiment, variations in aberration are calculated at nine image heights.

Figure 14:
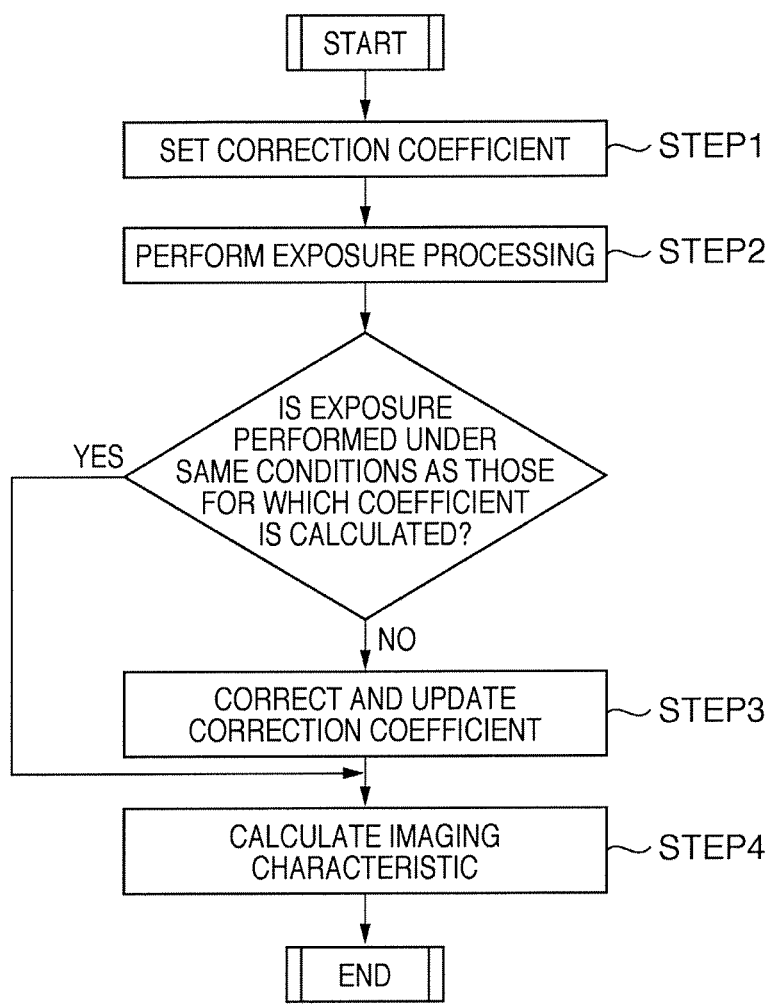
FIG. 14 is a flowchart illustrating exposure processing.

FIG. 14 illustrates an exposure sequence. The second calculator reads out a correction coefficient matching the current exposure conditions in step 1, and performs exposure processing in step 2. If the exposure conditions (e.g., the exposure amount and exposure area) for which the correction coefficient is calculated are different from those under which exposure is actually performed, a prediction error is generated in the aberration equation. In step 3, the second calculator corrects the error. Then, a correction coefficient best suited to the actual exposure conditions is set. In step 4, the second calculator calculates the aberration using the correction coefficient.

The second calculator calculates the maximum amount of variation (F1) for each image height from the correction coefficient calculated for each exposure condition and the actual exposure conditions (Q). After calculating the F1 value, the second calculator can predict the time characteristic of the amount of aberration variation ΔF by the Heating calculation and Cooling calculation in equations (2) and (3).

A method of correcting the amount of aberration variation calculated by aberration calculation at each image height will be explained. In the second process, the second calculator predicts the amount of aberration variation at each image height from the actual exposure conditions and the correction coefficient calculated in the first process, and calculates the position of a correction system so as to correct the amount of aberration variation. The projection optical system and a driving system which drives a stage such as the substrate stage constitute the correction system. The controller controls the correction system so as to reduce the amount of aberration variation calculated by the second calculator.

Figure 15:
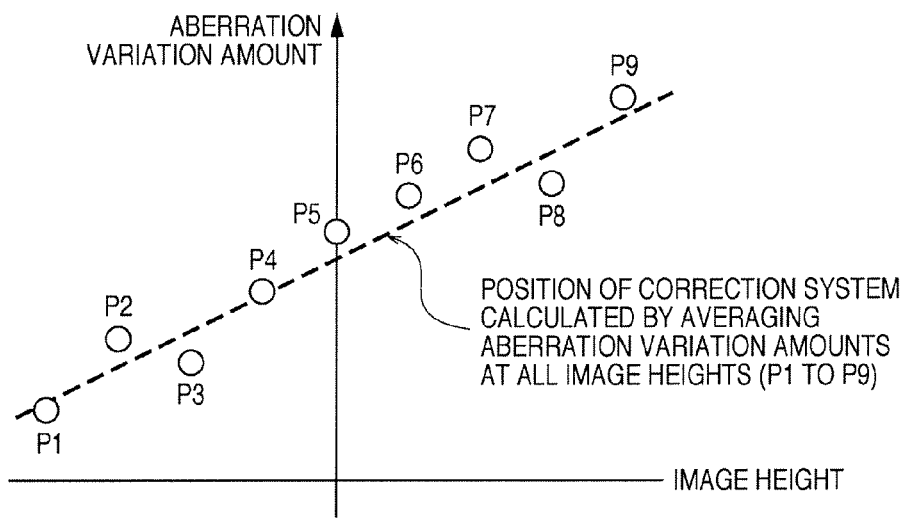
FIG. 15 is a graph showing an example of a correction position calculation method.
Figure 16:
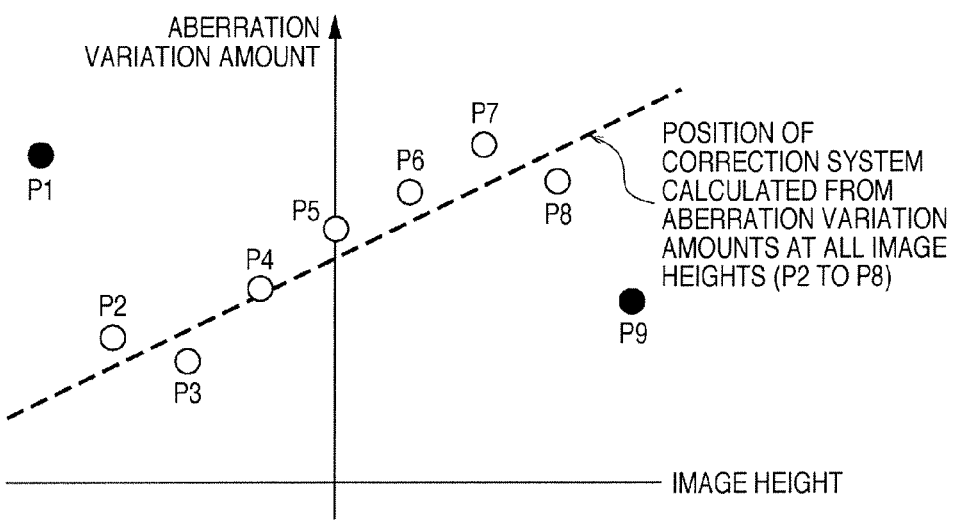
FIG. 16 is a graph showing another example of the correction position calculation method.

To calculate the position of the correction system so as to image an optimal pattern under the exposure conditions (e.g., the exposure area and exposure center), a method of averagely calculating aberration generated in the exposure area as shown in FIG. 15 is available. It is also possible to calculate the position of the correction system by predicting the amount of variation of an arbitrary aberration at an arbitrary image height based on aberration variation model simulation at a plurality of image heights, and weighting the variation in the arbitrary aberration at the arbitrary image height, as shown in FIG. 16. Although not shown, it is also possible to calculate the position of the correction system by predicting the amount of variation of an arbitrary aberration at an arbitrary image height based on aberration variation model simulation at a plurality of image heights, and weighting the variation in the arbitrary aberration.

The position of the correction system immediately before exposure is calculated by taking account of the influence of the pressure of an ambient gas surrounding the projection optical system on the imaging projection system from the output from a pressure sensor, and the offset amount set to an exposure parameter or apparatus parameter.

A method of driving the correction system to the calculated position by the controller will be explained. The projection optical system according to this embodiment mounts optical element drivers which accurately drive optical elements such as a lens and mirror in desired directions, in order to more precisely image a mask pattern.

Figure 17:
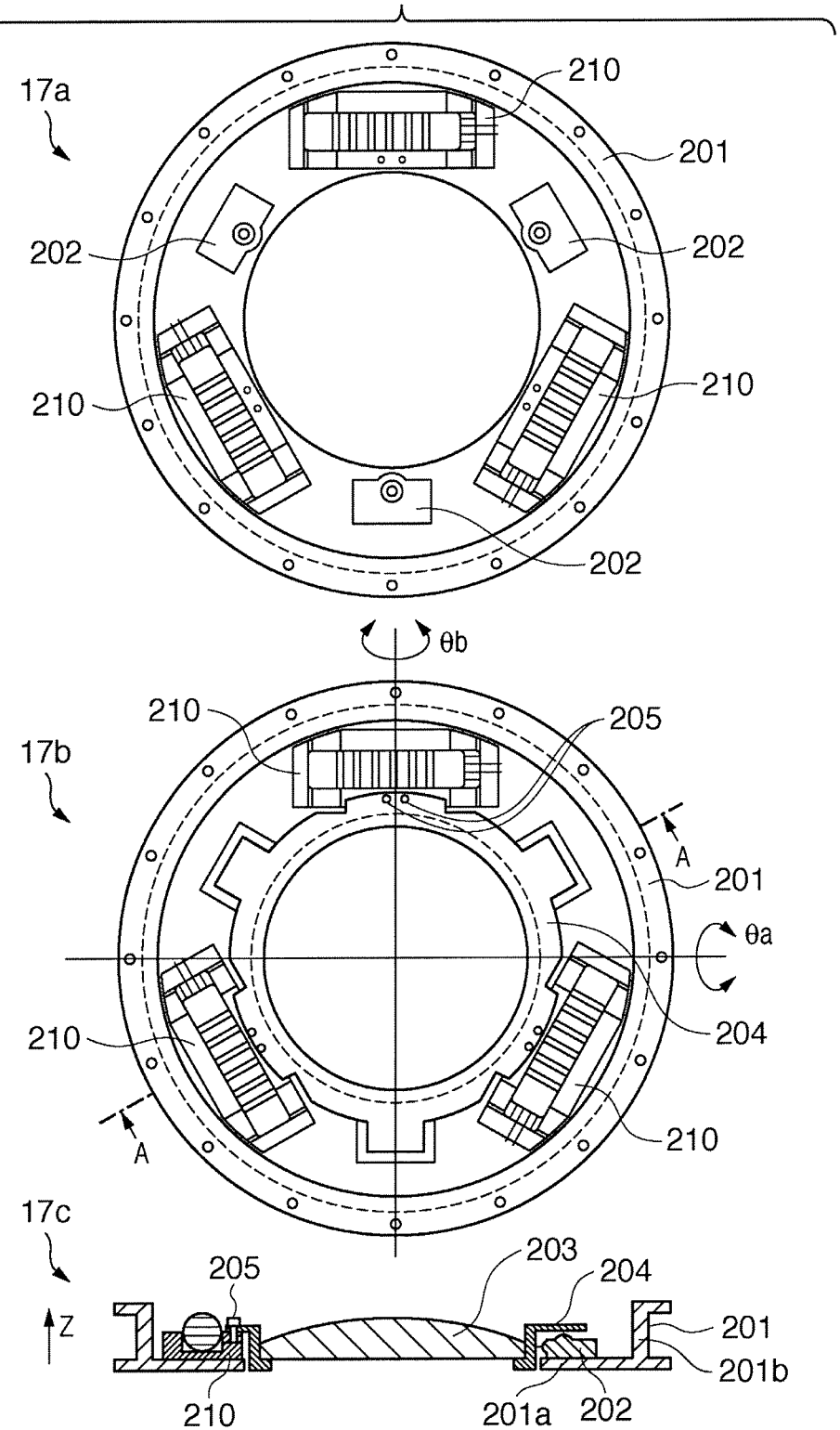
FIG. 17 is a plan view and a sectional view showing driving mechanisms of a projection system.

FIG. 17 shows an optical system driver inserted in the projection optical system according to this embodiment. These driving systems adopt the driving scheme disclosed in Japanese Patent Laid-Open No. 2007-206643. This driving scheme can drive the optical elements in desired directions. For example, 17a in FIG. 17 is a plan view of the optical system driver in which a lens and lens frame are detached. 17b in FIG. 17 is a plan view of the optical system driver in which the lens and lens frame are attached. 17c in FIG. 17 is a sectional view of the optical system driver. Referring to FIG. 17, a stationary lens barrel 201 comprises a bottom surface flat portion 201a for fixing optical element drivers 210 and lens position detectors 202, and a side wall cylindrical portion 201b to connect to other vertically adjacent lens units.

The optical element drivers 210 are formed from three identical driving mechanisms and are arranged on the bottom surface flat portion 201a of the stationary lens barrel 201. The lens position detector 202 detects displacements of the lens frame in its optical axis direction and its radial direction perpendicular to the optical axis. In accordance with the required detection accuracy, the lens position detector 202 is appropriately selected from, e.g., an interferometric measuring unit using a semiconductor laser, a capacitance displacement gauge, a linear encoder, and a differential transformer displacement gauge.

17b in FIG. 17 shows the state in which the lens and lens frame are mounted. A lens frame 204 which accommodates a lens 203 has projecting flange portions at six portions on its upper surface. Three of these flange portions are connected to displacement output portions of the optical element drivers 210 using lens frame attaching screws 205.

A laser interferometric displacement sensor is used as the lens position detector 202, as will be explained with reference to 17c in FIG. 17. For example, detection laser beams are projected onto the lens 203 in its optical axis direction and radial direction. Based on information on interference between the reflected light beams, displacements of the lens frame 204 in its optical axis direction (Z direction) and radial direction are detected at the three points (the vicinities of the flange portions). With the above-described arrangement, the lens 203 can be translated in the optical axis direction, i.e., the Z-axis direction shown in 17c in FIG. 17 as the three optical element drivers 210 are driven by equal amounts.

Differentiating the driving amounts of the three optical element drivers 210 by a predetermined amount allows the tilt driving in the θa and θb directions shown in 17b in FIG. 17. The translational and tilt driving amounts of the lens 203 can be precisely controlled by feeding back the output in the optical axis direction from the lens position detector 202 to these driving amounts. The amount of shift in an image on a plane perpendicular to the optical axis of the lens 203 upon parallel decentering is calculated by monitoring the output in the radial direction from the lens position detector 202.

The driving amount of, e.g., the wafer stage is determined by taking account of this calculation result so that any alignment error of a mask image upon lens decentering is eliminated. The above-described drivers of the projection optical system can tilt-drive the optical elements and can correct any aberrations by driving the optical elements in the Z direction. This makes it possible to correct, e.g., variations in aberration which are asymmetrical about the optical axis. To correct, e.g., the focus, a correction method by driving, in the Z direction, not only the projection optical system but also the driving unit (mask stage) which mounts the mask or the driving unit (wafer stage) which mounts the wafer or by tilt-driving them is also available.

Second Embodiment

An embodiment when the above-described aberration correction method is applied to a step & repeat exposure apparatus will be explained next with reference to FIG. 5. Since the step & repeat exposure apparatus does not scan a mask with a laser beam (illumination area), the illumination area on the mask is identical to the exposure area. Steps 1 and 2 in FIG. 5 are the same as those in the first embodiment.

Step 3 will be explained. As the first calculation processing procedure, the illumination area is divided into a plurality of areas in the X direction and/or Y direction, and the mask transmittances in the respective divided areas are individually calculated. In this embodiment, the dimension of the illumination area in the X direction is 26 mm (a value when converting the dimension of the illumination area in the X direction on the mask into that on the wafer), and the dimension of the illumination area in the Y direction is 33 mm (a value when converting the dimension of the illumination area in the Y direction on the mask into that on the wafer). Although this embodiment will exemplify a case in which the illumination area is divided into 4 rectangular areas in the X direction and 4 rectangular areas in the Y direction, i.e., a total of 16 rectangular areas, it may be divided by another method and the shape of each divided area is not particularly limited to a rectangle.

The mask transmittance in the divided area (to be referred to as divided area n; n is the area number that is one of 1 to 16 in this embodiment) is calculated as the average of transmittance data in a mask area included in division area n by:

$$(\text{the mask transmittance in divided area } n) = (\Sigma \text{ transmittance data})/(\text{the number of data points})$$

(Note that the Σ range is defined as only a mask area included in divided area n)

In step 4, the mask transmittance in divided area n is normalized, and a mask transmittance $r_n$ in each divided area is calculated.

In steps 5 and 6, an exposure area ratio $g_n$ of divided area n is calculated based on exposure area information. The exposure area information herein includes dimensions wx and wy of the exposure area in the X and Y directions, respectively, and an X-image height $x_0$ and Y-image height $y_0$ at the center of the exposure area. These pieces of information can be substituted by X-coordinates xr and x1 at the two ends of the exposure area in the X direction, and Y-coordinates yu and yd at the two ends of the exposure area in the Y direction.

The $g_n$ value is given as the area ratio between divided area n and a portion in divided area n, which is included in the illumination area under a certain set of exposure conditions. That is, the $g_n$ value can be calculated on a case-by-case basis as follows:

A case in which divided area n is included in the illumination area: $g_n=1$

A case in which divided area n is not included in the illumination area: $g_n=0$ A case in which divided area n is partially included in the illumination area: $g_n$=((the ratio of a portion in divided area n, which is included in the illumination area)/(the area of divided area n))

In step 7, the weighting coefficient is calculated for each divided area. Let $\lambda_n$ be the weighting coefficient calculated by multiplying the $r_n$ value calculated from the mask transmittance by the $g_n$ value calculated from the exposure area information. Then, the coefficient $\lambda_n$ corresponds to a value obtained by normalizing the amount of light energy which propagates through divided area n. Steps 3 to 7 are repeated for each divided area n, and the weighting coefficient $\lambda_n$ in each divided area n is calculated and stored.

Using the calculated weighting coefficient $\lambda_n$ for each divided area, an aberration function given by expression (2) is weighted, where n is the divided area number, I is the effective light source shape on the pupil plane, C is the type of aberration, and x and y are arbitrary X- and Y-image heights. Expression (2) represents the degree of influence of the mask transmittance and exposure area on the aberration C as an imaging characteristic, which is generated by the projection optical system when divided area n is exposed with the effective light source shape I by the unit exposure amount, as a function of the image height (x,y). The image height (x,y) is not particularly limited to image heights inside divided area n. This means that the light which enters divided area n can change the aberration not only at image heights inside divided area n but also at image heights outside divided area n. The aberration expression and its coefficients generally differ for each aberration C and can be, e.g., a focus expression or image shift expression. In general, the coefficients also differ for each effective light source shape I. In this embodiment, an appropriate function is selected based on the effective light source information read out in step 1.

The aberration function given by expression (2) is calculated in advance based on the aberration measurement result and/or simulation result. However, since it is difficult to calculate the value of expression (2) for an arbitrary divided area n, arbitrary effective light source shape I, and arbitrary image height (x,y), expression (2) may be determined by appropriately interpolating using the values calculated for several values each of n, I, and x.

Letting $(x_{0n}, y_{0n})$ be the image height at the center of divided area n, the aberration function in expression (2) may be substituted by:

$$f_n^{I,C}(x,y) \rightarrow F^{I,C}(x,x_{0n},y,y_{0n}) \tag{5}$$

so that the aberration function $F^{I,C}(x,x_{0n},y,y_{0n})$ is used for all divided areas 1 to 16.

The amount of aberration generation due to the influence of each divided area under specific exposure conditions can be calculated by multiplying the function in expression (2) by the weighting coefficient $\lambda_n$. This calculation is valid because the weighting coefficient $\lambda_n$ corresponds to the amount of light which enters divided area n under the exposure conditions, and the amount of aberration generation is proportional to the amount of incident light as is commonly known.

The sum of the amounts of aberration generation due to the influence of the divided areas is the amount of aberration generation under the exposure conditions. In the above-described example, the correction coefficient of a variation in focus at the image height coordinate position (0.0,0.0) under the exposure conditions is given by:

$$K^{Focus}(0.0, 0.0) = \sum_{n=1}^{16} \lambda_n f_n^{I,Focus}(0.0, 0.0) \tag{6}$$

which corresponds to K in equation (1).

These processing operations are performed for a combination of the number of image height coordinate positions to be corrected and that of aberrations to be corrected, thereby calculating the correction coefficient for each image height and aberration.

Third Embodiment

In this embodiment, the mask transmittances at a plurality of image heights are combined to be used as a mask transmittance at an arbitrary image height, as shown in FIG. 18. In this case, the average of a plurality of image heights can be used or the weighted average of a plurality of image heights by the exposure area can be calculated.

Assume that the aberration variation expression calculated at an arbitrary image height in equation (1) is substituted by:

$$\Delta F = K \times T/T0 \times Q \tag{4}$$

where T is the mask transmittance, and T0 is a normalized mask transmittance.

Even in this case, it is possible to predict a variation in aberration due to a difference in mask pattern density at an arbitrary image height.

The mask transmittance at an arbitrary image height is calculated from mask transmittance information. Substituting the calculated value in equation (4) yields $\Delta F$. When a variation in arbitrary aberration at an arbitrary image height is calculated from the actual exposure energy conditions, exposure time, and non-exposure time, it is possible to predict the variation in arbitrary aberration at the arbitrary image height.

As has been described in the first embodiment, there are a method of correcting a predicted variation in arbitrary aberration at an arbitrary image height by driving an optical element in, e.g., a projection optical system in the Z direction or tilt direction, and a method of correcting it by driving a mask stage or wafer stage.

Devices (e.g., a semiconductor device and liquid crystal display device) are manufactured by a step of exposing a substrate coated with a photosensitive agent to radiant energy using the above-described exposure apparatus, a step of developing the photosensitive agent on the substrate exposed in the exposing step, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-165312, filed Jun. 22, 2007, which is hereby incorporated by reference herein in its entirety.

What is claimed is:

1. An exposure apparatus for performing an exposure of a substrate to radiant energy via a pattern formed on a mask, the apparatus comprising:
   a projection optical system configured to project radiant energy from the mask onto the substrate;
   a first stage configured to hold the mask;
   a second stage configured to hold the substrate; and
   a controller configured to obtain, with respect to each of image heights, a coefficient of a term, including a time constant, in an equation for obtaining an aberration of the projection optical system that varies with time via the exposure, based on a distribution of a transmittance of the pattern over the image heights, and to control a drive of at least one of an optical element included in the projection optical system, the first stage and the second stage so as to reduce the aberration obtained with respect to each of the image heights,
   wherein the controller is configured to obtain the transmittance with respect to each of a plurality of regions obtained by dividing an exposure region of the pattern, to perform multiplication of a previously-obtained aberration of the projection optical system generated with respect to each of the image heights via the exposure with a unit exposure energy through each of the plurality of regions, by a weighting coefficient that is based on the transmittance of corresponding one of the plurality of regions, and to obtain the coefficient of the term, with respect to each of the image heights, by a sum of values obtained by the multiplication with respect to the plurality of regions.

2. The apparatus according to claim 1, wherein the aberration of the projection optical system generated with respect to each of the image heights via the exposure with the unit exposure energy is obtained in advance based on at least one of measurement and simulation.

3. The apparatus according to claim 1, wherein the distribution of the transmittance of the pattern over the image heights is measured by the exposure apparatus or calculated from design information of the mask.

4. The apparatus according to claim 1, wherein the controller is configured to obtain the coefficient, with respect to each of the image heights, further based on information about at least one of an effective light source, a scanning speed of the mask and an exposure time.

5. The apparatus according to claim 1, wherein the controller is configured to obtain the coefficient, with respect to each of the image heights, further based on a condition of the exposure.

6. The apparatus according to claim 1, wherein the controller is configured to control, as the drive, at least one of a drive in a direction parallel to an optical axis of the projection optical system and a tilt drive, with respect to at least one of the optical element, the first stage and the second stage.

7. The apparatus according to claim 1, wherein the controller is configured to weight the aberration obtained with respect to one of the image heights, and to control the drive of at least one of the optical element, the first stage and the second stage so as to reduce the weighted aberration.

8. The apparatus according to claim 1, wherein the aberration includes at least one of focus, magnification, distortion, astigmatism, spherical aberration, and coma aberration.

9. A method of manufacturing a device, the method comprising:
   exposing a substrate to radiant energy using an exposure apparatus;
   developing the exposed substrate; and
   processing the developed substrate to manufacture the device,
   wherein the exposure apparatus performs an exposure of a substrate to radiant energy via a pattern formed on a mask, the apparatus including:
   a projection optical system configured to project radiant energy from the mask onto the substrate;
   a first stage configured to hold the mask;
   a second stage configured to hold the substrate; and
   a controller configured to obtain, with respect to each of image heights, a coefficient of a term, including a time constant, in an equation for obtaining an aberration of the projection optical system that varies with time via the exposure, based on a distribution of a transmittance of the pattern over the image heights, and to control a drive of at least one of an optical element included in the projection optical system, the first stage and the second stage so as to reduce the aberration obtained with respect to each of the image heights,
   wherein the controller is configured to obtain the transmittance with respect to each of a plurality of regions obtained by dividing an exposure region of the pattern, to perform multiplication of a previously-obtained aberration of the projection optical system generated with respect to each of the image heights via the exposure with a unit exposure energy through each of the plurality of regions, by a weighting coefficient that is based on the transmittance of corresponding one of the plurality of regions, and to obtain the coefficient of the term, with respect to each of the image heights, by a sum of values obtained by the multiplication with respect to the plurality of regions.

* * * * *